US010126333B2

(12) United States Patent
Jourdan et al.

(10) Patent No.: US 10,126,333 B2
(45) Date of Patent: Nov. 13, 2018

(54) MULTISENSORY DETECTOR (71) Applicant: COMMISSARIAT A L'ENERGIE ATOMIQUE ET AUX ENE ALT, Paris (FR)

(72) Inventors: Guillaume Jourdan, Grenoble (FR); Bernard Diem, Echirolles (FR); Patrice Rey, St Jean de Moirans (FR); Philippe Robert, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/576,991

(22) Filed: Dec. 19, 2014

(65) Prior Publication Data

US 2015/0177281 A1    Jun. 25, 2015

(30) Foreign Application Priority Data

Dec. 20, 2013   (FR) ...................................... 13 63189

(51) Int. Cl.
*G01R 27/08*   (2006.01)
*G01R 17/10*   (2006.01)
(Continued)

(52) U.S. Cl.
CPC ....... *G01R 17/105* (2013.01); *G01R 19/0084* (2013.01); *G01R 33/0206* (2013.01); *G01R 33/038* (2013.01)

(58) Field of Classification Search
CPC ...... G01R 17/02; G01R 17/10; G01R 17/105; G01R 19/0084; G01R 33/0005;
(Continued)

(56) References Cited

U.S. PATENT DOCUMENTS 3,784,906 A  *  1/1974  Ironside ............... G01R 19/145
                                                324/706
6,422,088 B1 *  7/2002  Oba ........................ G01D 3/08
                                                73/754
(Continued)

FOREIGN PATENT DOCUMENTS

EP         2 541 222 A1      1/2013
FR         2 924 422 A1      6/2009
WO    WO 2011/048132 A1      4/2011

OTHER PUBLICATIONS

U.S. Appl. No. 14/687,501, filed Apr. 15, 2015, Joet, et al.
(Continued)

*Primary Examiner* — Jeff Natalini
*Assistant Examiner* — Steven Yeninas
(74) *Attorney, Agent, or Firm* — Oblon, McClelland, Maier & Neustadt, L.L.P.

(57) ABSTRACT

A measuring circuit for a multisensory detector is provided, including a plurality of detection branches mounted in parallel, with each detection branch of said plurality of detection branches including at least two dipoles mounted in series, and at least one reference branch, including a polarizing source and another at least two dipoles mounted in series, with the reference branch being connected in parallel to at least two detection branches among the plurality of detection branches, so as to form a Wheatstone bridge with each one of the detection branches among the plurality of detection branches.

14 Claims, 4 Drawing Sheets (51) Int. Cl.
*G01R 33/02* (2006.01)
*G01R 33/038* (2006.01)
*G01R 19/00* (2006.01)

(58) Field of Classification Search
CPC .............. G01R 33/0206; G01R 33/038; G01R 33/028; G01R 17/00; G01R 17/12; G01R 17/18; G01R 19/0092; G01R 19/06; G01R 19/145; G01R 19/15; G01R 19/155; G01R 33/0286
USPC ....... 324/247, 252, 654, 656, 657, 658, 679, 324/680, 705, 706, 725; 327/84, 92, 423, 327/448, 494, 508, 587, 588
See application file for complete search history.

(56) References Cited

U.S. PATENT DOCUMENTS

| | | | | |
|---|---|---|---|---|
| 6,701,296 | B1* | 3/2004 | Kramer | A61B 5/6806 370/545 |
| 2005/0270014 | A1* | 12/2005 | Zribi | G01R 33/0283 324/126 |
| 2007/0267708 | A1* | 11/2007 | Courcimault | B81C 1/00301 257/414 |
| 2008/0012558 | A1* | 1/2008 | Rossler | B82Y 25/00 324/252 |
| 2008/0054895 | A1* | 3/2008 | Sasaki | B82Y 25/00 324/252 |
| 2008/0315568 | A1* | 12/2008 | Bergvall | B60R 21/0136 280/735 |
| 2009/0139342 | A1 | 6/2009 | Robert et al. | |
| 2011/0187350 | A1* | 8/2011 | Ausserlechner | G01D 5/145 324/202 |
| 2011/0290037 | A1* | 12/2011 | Delapierre | G01L 1/148 73/862.044 |
| 2012/0166122 | A1 | 6/2012 | Bottinelli et al. | |
| 2012/0210792 | A1 | 8/2012 | Robert et al. | |
| 2012/0286379 | A1* | 11/2012 | Inoue | B81C 3/001 257/415 |
| 2013/0000411 | A1 | 1/2013 | Robert et al. | |
| 2013/0002244 | A1* | 1/2013 | Quevy | G01R 33/0286 324/244 |
| 2013/0087863 | A1* | 4/2013 | Chiou | G01L 9/0052 257/417 |
| 2014/0239979 | A1* | 8/2014 | Wygant | B81B 7/007 324/658 |
| 2014/0338459 | A1* | 11/2014 | Besling | G01L 9/0073 73/718 |
| 2016/0289063 | A1* | 10/2016 | Ocak | B81B 7/0048 |

OTHER PUBLICATIONS

French Preliminary Search Report dated Nov. 6, 2014 in French Application 13 63189, filed on Dec. 20, 2013 (with English Translation of Categories of Cited Documents an Written Opinion).

O. Leman et al. "An inertial smart-sensor based on silicon nanowires for wireless sportive activity monitoring", IEEE, 2011, 4 pages.

Duy-Dong Pham et al. "Position Sensing and Electrostatic Actuation Circuits for 2-D Scanning MEMS Micromirror", Defense Science Research Conference and Expo (DSR), 2011, 4 pages.

Matti Paavola et al. "A Micropower Interface ASIC for a Capacitive 3-Axis Micro-Accelerometer", IEEE Journal of Solid-State Circuits, vol. 42, No. 12, 2007, 15 pages.

* cited by examiner

MULTISENSORY DETECTOR

FIELD OF THE INVENTION

The present invention relates to the microelectronics industry, which covers the microelectronics as well as the nanoelectronics techniques. More particularly, the invention relates to a multisensory detector for a microelectromechanical («MEMS») or a nanoelectromechanical («NEMS») system.

TECHNOLOGICAL BACKGROUND

The consumer market of the multi-sensory detectors such as 3-axis accelerometers, 3-axis magnetometers, 3-axis gyrometers and pressure detector types, is oriented towards always smaller sizes of components to reach a competitive cost.

Thus, the size of a 9-axis detector, including a silicon chip of the microelectromechanical system («MEMS») type, the signal processing electronics comprising the integrated circuit specific to an application (the acronym «ASIC» for «Application-Specific Integrated Circuit») and the package, currently has a dimension of $4\times4$ mm$^2$ (mm=millimetre) and will very soon reach $3\times3$ mm$^2$. Such dimensions require the silicon chip alone to have a size of about 4 mm$^2$. In this context of drastic space constraints, the production of MEMS structures comprising 6, 9 or even 10 measuring axes (or measurands) and requiring an important number of pads to provide the interconnection with the reading electronics of each axis, may, in some cases, seem redhibitory. As a matter of fact, this would lead to a size of components larger than the space required for positioning the MEMS structures, and thus entail a much too high cost of production.

Generally, the elements considered as sensitive occupy less than 25% of the total size of the silicon chip. The major part of the surface is dedicated to the tracks routing the signals (supply, detection), to the pads connecting the chip to the external components (ASIC), to the sealing string receiving an additional substrate intended to form a protective cover.

For example, in a 6-axis measuring detector (such as a detector comprising 3-axis accelerometers and 3-axis gyrometers), each of the axes is detected by a Wheatstone bridge. The three Wheatstone bridges required for the accelerometers are connected to distinct supplies; as are the three Wheatstone bridges required for the gyrometers. To eliminate the influence of the parasitic dipoles outside the bridge, the voltage is measured at the terminals of each bridge. Two pads for actuating and controlling the seismic mass are added for each gyrometer, and a self-test pad is added for the accelerometers. Such system requires a minimum of 4 pads for the supply, 12 pads for measuring the voltages supplied to the terminals of each bridge, 12 pads for measuring the unbalance of each bridge, 6 pads for actuating and controlling the seismic masses of the gyrometers and a pad for self-test of the accelerometers. A minimum total number of 35 pads is thus reached, which are often distributed because of the production constraints, on two sides of the chip. For a typical pitch between the pads of 200 micron ($\mu$m=micrometer=$10^{-6}$ meter), one of the dimensions of the chip is 3.6 millimeters minimum. For a minimum dimension in the other direction of about 1.5 to 2 millimeters, a minimum size of the chip ranging from 5.4 to 7.2 mm$^2$ is obtained, whereas the dimension of the currently available products with a detection of the capacitive type is already lower than 5 mm$^2$ and the trend is oriented towards even smaller dimensions. The production of the pads may thus be a limiting factor for reducing the size of the MEMS component.

A need also exists for limiting the electric consumption which is high in the current mountings using Wheatstone bridges.

An object of the present invention is to provide a multisensory detector optimizing the connections and specifically in order to limit the size of the components.

Particularly advantageously, the invention also aims at reducing the energy consumption of such a detector.

SUMMARY OF THE INVENTION

The invention relates to a measuring circuit for a multisensory detector characterized in that it comprises:
a plurality of detection branches mounted in parallel, with each one comprising at least two dipoles mounted in series,
and, at least one reference branch, comprising a polarizing source and at least two dipoles mounted in series; with said reference branch being connected in parallel to at least two detection branches among the plurality of branches, so as to form a Wheatstone bridge with each one of the detection branches among the plurality of detection branches.

The invention also relates to a multisensory detector comprising at least one measuring circuit according to the invention.

The invention implements a so-called multi-bridge mounting, consisting in connecting a reference branch to a plurality of detection branches in order to share the same polarizing source, and thus reduce the energy consumption.

The mounting provided also offers a solution for reducing the number of pads present on a microelectromechanical system. The pads are access means enabling to measure the impedance variations of a dipole. Such solution relies on the sharing of access pads by the different detection branches comprising the dipoles which constitute each a measurand. The interconnection of the detection branches is preferably carried out on a substrate, comprising a system of the MEMS or NEMS types.

BRIEF DESCRIPTION OF THE FIGURES

Other characteristics, aims and advantages of the invention will emerge better from the detailed description of an embodiment of the latter, which are illustrated by the following accompanying drawings wherein.

The drawings appended herein are given as examples and are not limiting to the invention. These are schematic drawings intended to facilitate the understanding of the invention and are not necessarily at the scale of practical applications.

DETAILED DESCRIPTION

Before making a detailed review of the embodiments of the invention, optional characteristics which may be used in combination or as alternative solutions are listed hereafter:

Advantageously, the circuit comprises at least one dipole having a variable impedance according to the evolution of a measurand in at least one detection branch.

The reference branch is connected to the detection branches, either directly, or using a first pad and a second polarizing pad.

Each detection branch is particularly advantageously connected to at least one central measuring pad located between the dipoles of said detection branch, at the mid-point of the detection branches.

Two additional measuring pads are preferably mounted in parallel and so configured as to control the polarizing voltage of the detection branches.

The multisensory detector particularly advantageously comprises at least the measuring circuit.

Advantageously, the measuring circuit is partially formed at least on a first substrate and a second substrate; with said substrates being assembled so as to form a cavity.

When the reference branch is connected in parallel to the detection branches by means of the first pad and of the second polarizing pad, at least one among said measuring pads, central measuring pads and additional measuring pads is advantageously located on the first substrate and/or on the second substrate.

Advantageously the reference branch is at least partially positioned on the first substrate and/or at least partially positioned on the second substrate.

Preferably, each detection branch is at least partially positioned on the first substrate.

Advantageously, each detection branch is connected to at least one central measuring pad; with said measuring pad being located on the second substrate or the first substrate.

According to one particularly advantageous embodiment, the detector comprises a microelectromechanical and/or nanoelectromechanical system.

Advantageously, the microelectromechanical and/or nanoelectromechanical system is located in the cavity.

Preferably, the micro-electromechanical and/or nano-electromechanical system-electromechanical comprise(s) at least one mobile mass.

According to one preferred embodiment, the microelectromechanical and/or nanoelectromechanical system is produced on the first substrate.

Advantageously, the first substrate and/or the second substrate comprise(s) interconnection tracks.

Figure 1:
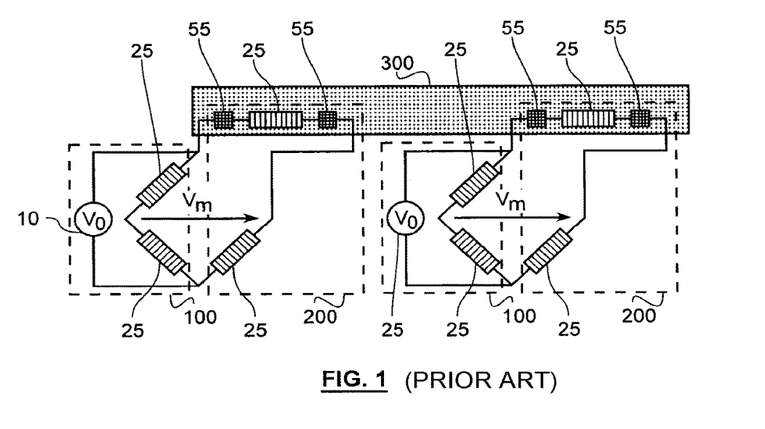
FIG. 1 is a schematic illustration of a multisensory detector according to the prior art, requiring as many polarizing sources as measurands. Each detection branch comprises a dipole having an impedance varying according to the evolution of a measurand.

FIG. 1 illustrates a conventional electric circuit associated to a detector with two measurands. A measurand is an input physical quantity transformed into another output physical quantity or into an electric signal. The physical quantities may be, for example, of the mechanical (displacement, force, mass, flow), thermal (temperature, heat capacity, heat flow), electric (current, voltage, charge, impedance, dielectric), magnetic (magnetic field), radiative (visible light, X-rays, micro-waves) or still (bio-)chemical (humidity, gas) types.

The measuring circuit, according to such embodiment, comprises several reference branches 100. Each reference branch 100 comprises a polarizing source 10 and at least two dipoles 25 mounted in series. The circuit also comprises detection branches 200. Each detection branch 200 comprises at least two dipoles 25 mounted in series. For each measurand, a reference branch 100 is associated with a detection branch 200 so as to form a Wheatstone bridge.

In this case, one of the dipoles 25 of the detection branch 200 represents a passive transducer i.e. a dipole having a variable impedance which may be resistive, capacitive or inductive. The number of pads 55 to implement per measurand is two: a first pad 55 is so configured as to inject the polarizing current whereas a second pad 55 is so configured as to extract the polarizing current.

In this context, if n measurands are considered, the number of pads 55, required to enable the reading of each advantageously passive transducer 25, is equal to 2×n. For example, for a detector having 10 axes i.e. 10 measurands, 20 connection pads 55 are then required.

The dipoles 25 may be read using a Wheatstone bridge mounting, from the Vm output voltage. The reference branch 100 which generates the reference potential is, in such exemplary configuration, totally produced outside the substrate 300. Advantageously, the substrate 300 comprises a chip of the microelectromechanical system (the acronym for MEMS, i.e. MicroElectroMechanical System) type. Only half the detection branch 200 is present on the substrate 300.

Figure 2:
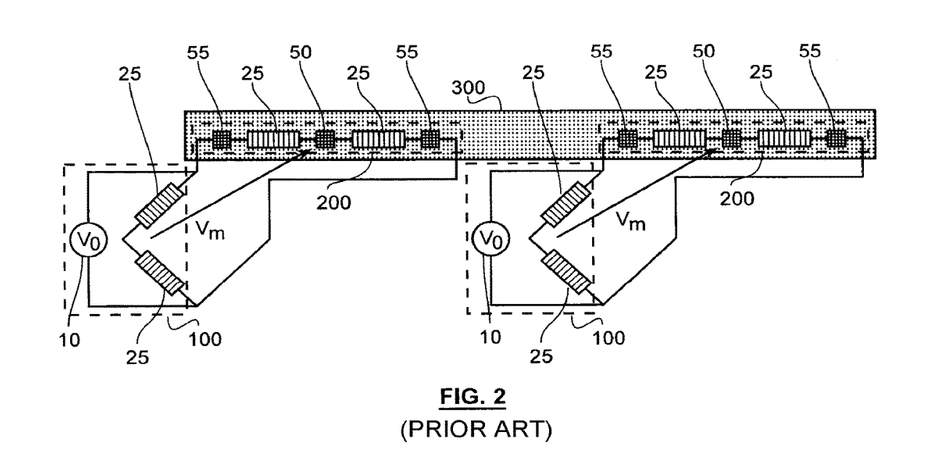
FIG. 2 is a schematic illustration of a multisensory detector according to the prior art, requiring as many polarizing sources as measurands. Each detection branch comprises two dipoles having an impedance varying according to the evolution of a measurand.

FIG. 2 illustrates an electric circuit comprising a detector wherein each detection branch 200 has two advantageously passive transducers 25 submitted to opposed measurands. This differential detection strategy is often preferred since it makes it possible to advantageously eliminate the identical variations in impedance produced by of the influence quantities such as temperature, using a Wheatstone bridge.

When two advantageously passive transducers 25 are present on a detector, the number of pads 50, 55 to implement per measurand is three: a first pad 55 is so configured as to inject the polarizing current, a second pad 55 to extract the current polarizing and a third central measuring pad 50 to read the unbalance of the bridge.

In this context, if we consider n measurands, the number of pads 50, 55 required for enabling the reading of each passive transducer 25 is of 3×n. For example, for a detector having 10 axes i.e. 10 measurands, 30 pads 50, 55 are required then.

The dipoles 25 may be read using a Wheatstone bridge mounting, from the Vm voltage output. The reference branch 100 which generates the reference potential is, in such exemplary configuration, totally produced outside the substrate 300. On the contrary, the detection branch 200 is produced from the substrate 300.

The mountings of FIGS. 1 and 2 according to the prior art all have as many reference branches 100 as measurands, and thus as detection branches 200.

For a continuous reading mode for which the assembly of the advantageously passive transducers 25 must be simultaneously polarized, electric current goes through all the reference branches 100. As the power consumption is an increasing function relative to the number of polarized reference branches 100 (provided such branches have the same dipoles 25; as is generally the case, since it is preferable to use the same transductive dipoles so that they can be sensitive to the same influence quantities), the invention provides for a reduction in the number of reference branches 100.

According to an exemplary embodiment, for a current generating 100 micro-amperes (µA) and of 4,000 Ohms (Ω) dipoles, the power lost through Joule effect amounts to 40 micro-Watts (µW). The typical solutions discussed in the paragraphs above then require a power of 80 µW to polarize a measurand.

FIGS. 3 to 8 illustrate embodiments according to the present invention.

Figure 3:
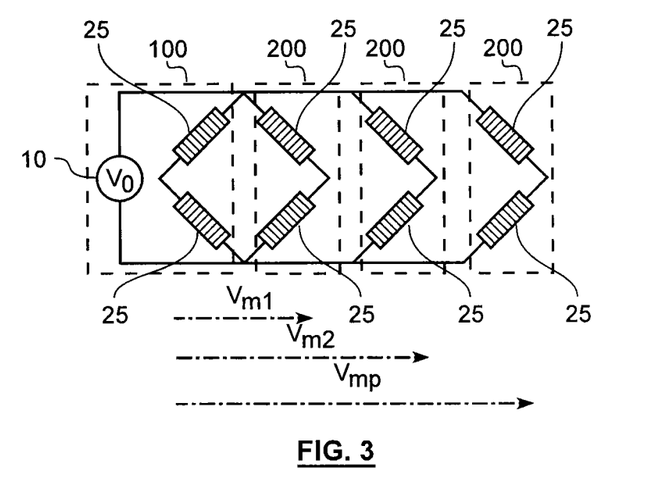
FIG. 3 is a schematic illustration of a multisensory detector according to the invention requiring a polarizing source for a plurality of measurands. A measurand is associated with each detection branch.

FIG. 3 shows a principle drawing of a mounting of the multi-bridge type, consisting in interconnecting, according to a Wheatstone bridge, a plurality of detection branches 200 comprising at least one passive transducer 25 so that the plurality of detection branches 200 share a common polarizing source 10 of a reference branch 100.

The Vm measuring signal for each measurand corresponds to the differential voltage between the mid-point of the so-called reference branch 100 (the impedances being sensitive or not to a measurand or to the influence quantities) and the mid-point of a detection branch 200; with said branch 200 being provided with at least one passive transducer 25, associated with a measurand. The invention provides, among other solutions, to share the same reference branch 100 to generate the $V_O$ reference potential used by all the detection branches 200.

This specifically results in a reduction of the drain current of the polarizing source 10 as compared to the situation wherein as many reference branches 100 (i.e. polarizing sources 10) as measurands (i.e. detection branches 200) may be introduced.

The power consumption of such a mounting is thus reduced by a factor of about two when the number of measurands increases. According to not restrictive exemplary embodiments of the invention, for a device with two measurands, the mounting only requires three branches to be polarized (i.e. a reference branch 100 and two detection branches 200) instead of four branches 100, 200 required in the mounting according to the prior art. For a device with seven measurands, the mounting according to the invention will only require eight branches to be polarized (i.e. a reference branch 100 and seven detection branches 200) instead of fourteen branches 100, 200 required in the mounting according to the prior art.

Figure 4:
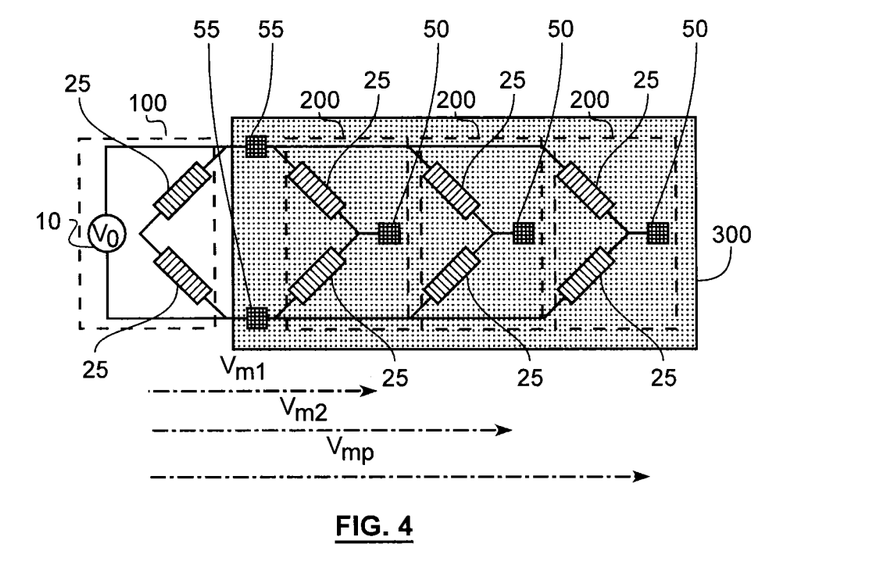
FIGS. 4 to 6 illustrate schematic representations of a multisensory detector according to the invention requiring a polarizing source for a plurality of measurands. A measurand and a measuring pad are associated with each detection branch.

FIG. 4 illustrates the sharing of polarizing pads 55 for detectors having, each, two advantageously passive transducers 25. FIG. 4 more particularly shows the positioning of the advantageously passive transducers 25 and of a plurality of pads 50, 55. Two pads 55 among the plurality of pads 50, 55 make it possible to polarize the detection branches 200 associated with each detection axis. Such two pads 55 are advantageously connected to the polarizing source 10. The Vm measuring signal for each measurand is built on the potential difference between the mid-point of each detection branch 200 and the mid-point of the reference branch 100. A central measuring pad 50 is thus positioned at the mid-point of each detection branch 200, so as to extract a measurand for each detection branch 200. In this configuration mode, the interconnection of the detection branches 200 is produced on the substrate 300. The number of pads 50, 55 required for interfacing the substrate 300 i.e. the microelectromechanical system with an external device (for example, another substrate, supply sources, etc.) is then equal to n+2, where n is the number of measurands.

When only one transducer 25 is present on each detection branch 200, only one of the two pads 55 may be shared by the different measurands. This makes it possible to reduce the number of pads 50, 55 to n+1 (where n is the number of measurands) instead of 2×n for the known solution of the prior art. Advantageously, such device leads to a reduction of n−1 pads 50, 55. According to an example of configuration, for a device with 10 measurands, only 11 pads 50, 55 are advantageously required, according to the invention, as compared to 20 pads 50, 55 required, according to the prior art. In the case where two transducers per detection axis are present, two pads 55 may be shared for each detection branch 200. Thus, this makes it possible to reduce the number of pads 50, 55 to n+2 (where n is the number of measurands) instead of 3×n for the known solution of the prior art, which leads to an advantageous reduction of 2×(n−1) pads 50, 55. According to an example of configuration, for a device to 10 measurands, only 12 pads 50, 55 are required, according to the invention, as compared to 30 pads 50, 55 required, according to the prior art.

In the previous two cases, a significant gain may particularly advantageously be obtained as regards the number of polarizing pads 55 and of central measuring pads 50, more particularly when the number of measurands, on the substrate 300 preferably comprising a microelectromechanical system (MEMS), becomes important. The invention is not limited to the microelectromechanical systems but also applies to the nanoelectromechanical systems (NEMS).

Figure 5:
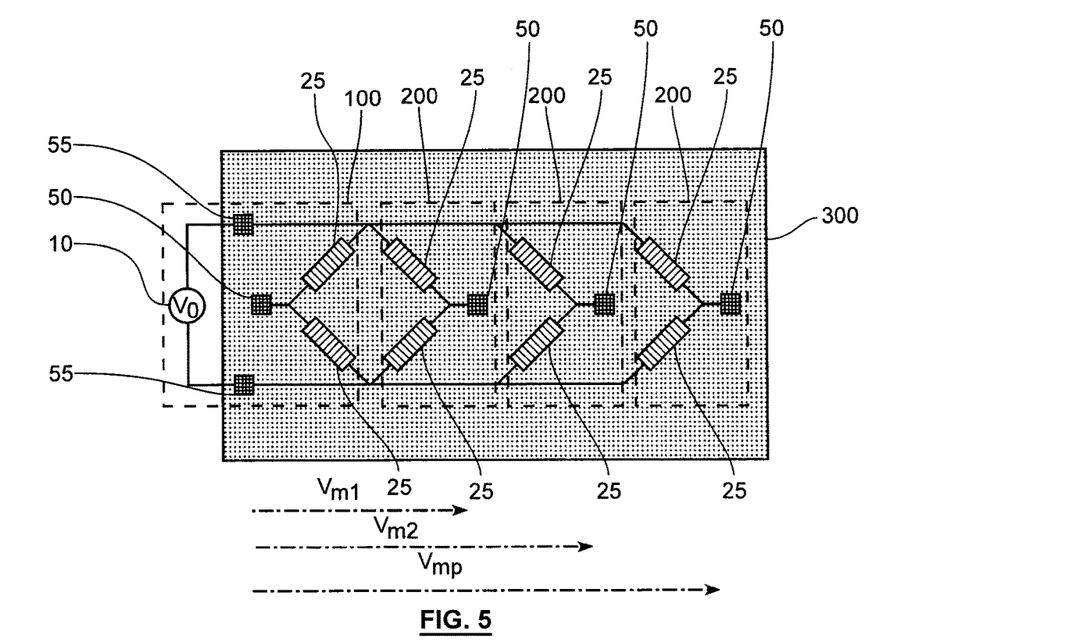

FIG. 5 illustrates a mounting according to the present invention wherein the reference branch 100 is integrated in the substrate 300 i.e. in the microelectromechanical system. The reference branch 100 is, advantageously, supplied by the same pads 55 as the detection branches 200. An additional central measuring pad 50 is required to reach the mid-point of the reference branch 100 which generates the reference potential. The number of pads 50, 55 required is thus equal, in this embodiment, to n+3, where n is the number of measurands.

The reference branch 100 makes it possible to reproduce the potential of the detection branches 200 associated with to each measurand when the latter are at rest. The reference branch 100, integrated to the substrate 300 comprising a microelectromechanical system, is thus positioned close to the different detectors. Such reference branch 100 may, according to one particularly advantageous embodiment, be connected to the rest of the mounting using the present electric tracks, for example, on the substrate 300, advantageously on the microelectromechanical system.

Such configuration offers several advantages. The reference branch 100 may advantageously be produced with the same advantageously passive transducers 25 as the detection branches 200. The reference branch 100 will thus advantageously have a similar or even identical behaviour, to the detection branches 200 as regards the influence quantities. Besides, the tracks associated with the mid-bridge potentials of the detection branches 200 and of the reference branch 100 may advantageously be held close to one another. Such positioning favours, among others, a reduction in the sensitivity to the electromagnetic disturbances which affect the differential mode of the measuring signals (for example, the induction loops, the capacitive coupling, the inductive coupling, etc.).

The mid-bridge potential of the reference branch 100 will thus be particularly advantageously modified as the Vm potential of the detection branches 200, in presence of extra-bridge dipole of access to the advantageously passive transducers (parasitic dipoles).

In most embodiments, the reference branch 100 is insensitive to one of the measurands of the multisensory detector. According to the present invention, making the reference branch 100 sensitive to one of such measurands so as to subtract such measurand from another measurand may particularly advantageously be considered. For example, on a detector of three-dimensional accelerometric and magnetometric movements (i.e. a 6-axis detector: 3-axis accelerometer and 3-axis magnetometer, so-called «3A3M»), a detection branch 200 may be sensitive to the combination of acceleration and of the magnetic field αxa+B, where a is a measurand, B the value of the magnetic field. If the reference branch 100 is so designed as to be sensitive to the acceleration αxa, the Vm measuring signal makes it possible to obtain the value of the magnetic field B alone. Similarly, it may be considered to start from a configuration where the reference branch 100 is sensitive to the measurand a and a detection branch 200 to the measurand a, whereas the Vm measuring signal produced is sensitive to such measurand Vm=2a. However, in both above situations, the signal present on the reference branch 100 is deduced from the assembly of detection branches 200. Such embodiment is particularly advantageous in the case where all the detection branches 200 are similarly affected by such measurand.

Figure 6:
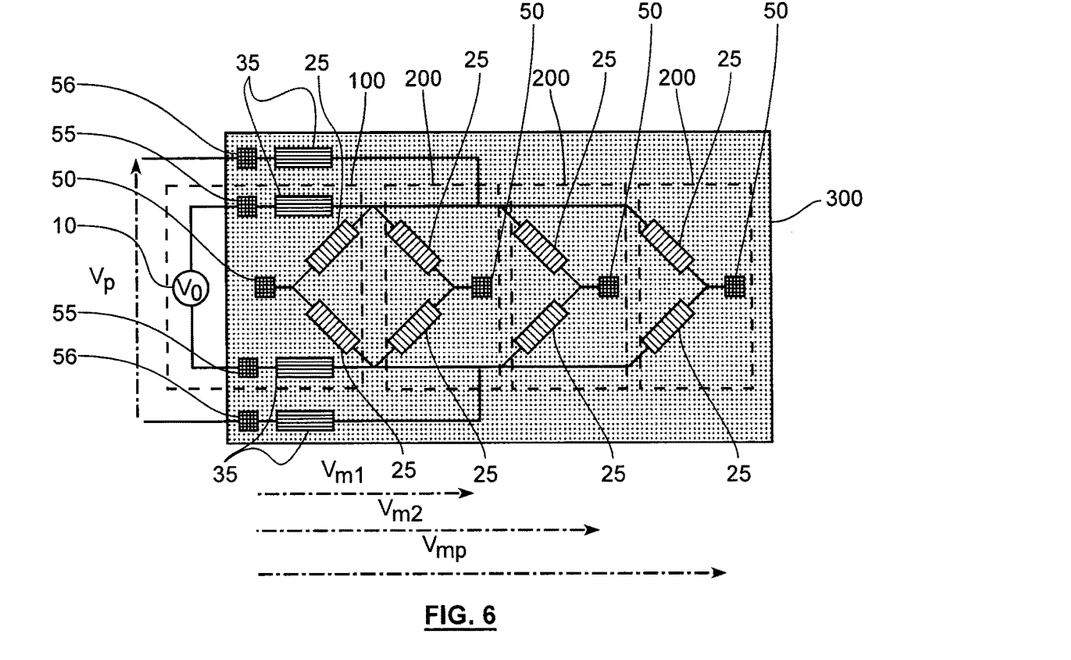

FIG. 6 illustrates one embodiment wherein two additional measuring pads 56 have been added to a mounting in order to control the Vp polarizing voltage of the detection branches 200. Such additional measuring pads 56 preferably positioned on the substrate 300, advantageously make it possible to measure the bridge voltage and thus supply a correction to the Vm measuring signal. As a matter of fact the ratio between such two signals makes it possible to eliminate the influence of the extra-bridge dipoles. Such additional measuring access pads 56 may comprise unstable dipoles 35 (for example, resistances) or/and having an important value such as those produced during an eutectic sealing between two materials, for example between gold (Au) and silicon (Si). The impact thereof is all the more negligible since the input impedance of the voltage measuring stage is high.

The different detection branches 200 in the mounting may in some situations affect one another. If the dipoles 25 are not perfectly balanced within each detection branch 200 and/or do not have the same sensitivity, the global impedance of the assembly of detection and reference branches 200 may be modified. Such effect may subsequently affect the global impedance of the multi-bridge mounting wherein the impedances of the detection branches 200 are placed in parallel. This results in an alteration of the polarizing voltage actually applied to the terminals of the detection branches 200. The solution provided makes it possible to remedy such problem. As regards electricity, the disturbance detected by each detection branch 200 is identical to the one wherein extra-bridge dipoles 35 modify the polarizing voltage of the multi-bridge mounting.

Figure 7:
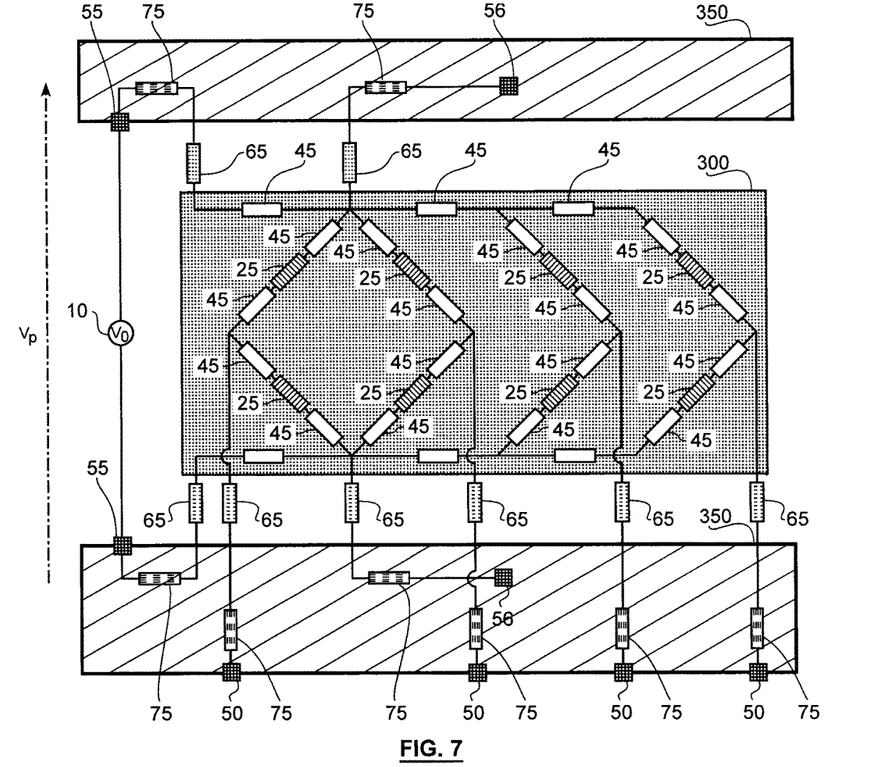
FIG. 7 is a schematic illustration of a multisensory detector according to the invention. In such embodiment, the additional measuring (or access) pads are positioned on an additional substrate.

FIG. 7 is a schematic illustration of the electric circuit partially forming the measuring detector according to the present invention. Advantageously, the reference branch 100 and the detection branches 200 are located on a first substrate 300, preferably forming a microelectromechanical system. According to another embodiment, the pads 50, 55, 56 are positioned on the first substrate 300 and/or on the second substrate 350. According to one particularly advantageous embodiment, the pads 50, 55, 56 are positioned on a second substrate 350 only. Advantageously, the first and second substrates 300, 350 are made of a semi-conductor material. The substrates 300, 350 may, for example, be silicon-based.

The dipoles which connect the advantageously passive transducers 25 to the substrate 300 compose intra-bridge parasitic dipoles 45. In order to solve the resistance issues, the intra-bridge parasitic dipoles 45 should be reduced as much as possible. Such dipoles may be considered as having a negligible impact on the operation of the detector if the value thereof does not exceed 1% of the impedance of the advantageously passive transducers 25. Such value is acceptable if, for example, the stability of such parasitic dipoles is confirmed at 1%. Then, the global disturbance caused in the detection branch 200 is of the order of 100 parts per million (ppm) of the value of the impedance of the transducer 25. Such level of disturbance must be lower than the minimum variation desired for such transducer 25.

According to this advantageous, but not restrictive embodiment of the invention, the extra-bridge parasitic dipoles 65, 75 are all located outside the multi-bridge mounting. When the intra-bridge access dipoles 45 remain between the advantageously passive transducers 25, the latter may be integrated in the impedances of the advantageously passive transducers 25 if the behaviour thereof relative to the influence quantities is identical.

In this case, the polarizing voltage applied to the two interconnection nodes of the branches 100, 200 may be altered by such extra-bridge parasitic dipoles 65, 75.

Besides, the method of production may generate high parasitic interconnection dipoles 65. This is the case when a metal sealing, for example of the eutectic (gold-silicon (Au—Si), aluminium-germanium (Al—Ge) gold-tin (Au—Sn), etc.)) type is required in order to interconnect conductor tracks from a first substrate 300 to a second substrate 350. The value of the parasitic dipole 65 of such a sealing may be high. In such a situation, the parasitic dipoles 65 of the sealing must preferably be positioned outside the Wheatstone bridges, for example at the interface between the first and a second substrate 350, different from the first substrate 300, comprising the Wheatstone bridges. The advantageously passive transducers 25 of the bridges should therefore be interconnected downstream of such parasitic dipoles 65 relative to the polarizing pads 55 and/or additional measuring pads 56. According to an exemplary embodiment, this may be obtained by means of a continuous layer of electrically conducting materials. Such layer may, for example, be made of doped silicon and a metal such as aluminium. As a matter of fact, using a material having a good conductivity makes it possible to efficiently reduce the dipoles of the tracks between two transducers 25 thanks to appropriate dimensions of the tracks. For example, tracks having an impedance of less than 1 Ohm may be produced with a layer of silicon and aluminium and be negligible as compared to the advantageously passive transducers 25 having impedances of about 2,000 Ohms. The provided disposition thus solves the problem wherein dipoles having a high contact value or an unstable behaviour may appear when sealing a first substrate 300 and a second substrate 350, on their pads 50, 55, 56. A discontinuity between the conductors of the first substrate 300 and of the second substrate 350 is thus obtained.

In the drawing of FIG. 7, the parasitic dipoles 65 with a high value of the metal sealing are positioned outside the bridges, and are not included in the measuring circuit, if the dipole thereof is low as compared to the input impedance of the Vp and Vm voltages measuring stage.

Figure 8:
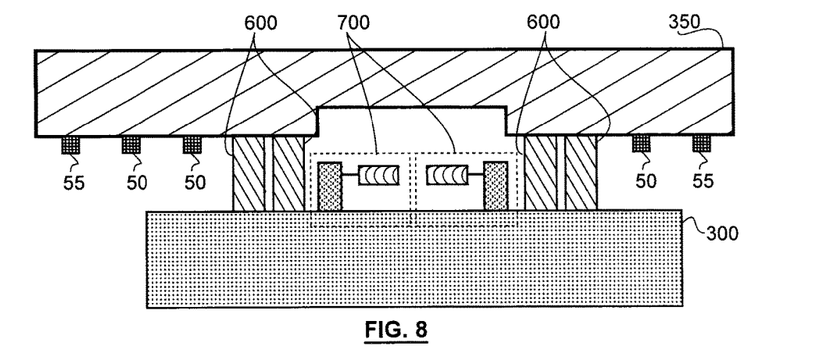
FIG. 8 is a multisensory detector having two measurands. In this case, five pads are positioned on the additional substrate.

FIG. 8 is a schematic illustration of the detector. A first substrate 300 preferably comprises a microelectromechanical system formed at least of an electric circuit, interconnection tracks 600 and gauges 700. The first substrate 300 advantageously comprises interconnection tracks 600 so configured as to route information (for example, the physical quantities, the electric signal) from one pad 50, 55, 56 to another one. A second substrate 350 is advantageously sealed to the first substrate 300 by means of an interconnection tracks 600 sealing, so as to form a cavity accommodating at least the gauges 700. The gauges 700 are, according to a preferred embodiment, of the piezo-resistive type. For example, with gauge detectors, an elastic deformation of the measuring element is first converted into a variation in the resistance of the gauge, to subsequently generate an electric output signal of a Wheatstone bridge circuit. Advantageously, the circuit comprises at least one mobile mass. According to one particularly advantageous embodiment, the pads 50, 55, 56 are positioned on a second substrate 350.

FIG. 8 shows a two measurand detector. In this case, 5 pads 50, 55, 56 are positioned on the second substrate 350: i.e. 2 pads 55 for polarizing, 1 central measuring pad 50 for the reference branch 100 and 2 measuring pads 50 for the 2 measurands extracted from the two detection branches 200.

The table hereunder compares the number of pads 50, 55, 56 required on the substrate 300 in order to produce various configurations. In this exemplary embodiment, two advantageously passive transducers 25 are present on each detection branch 200. Each configuration mentioned in the table makes it possible to solve some problems which may arise, in practice, when positioning a measuring mounting (for example, issues relating to the unbalanced branches 200 of the Wheatstone bridge, to the parasitic dipoles 45, 65, 75, etc.). The mounting, according to the present invention, particularly advantageously enables a gain (i.e. a reduction) in the number of pads 50, 55, 56 for each situation, whatever the number of measurands n, specifically for a number n above 1.

| CONFIGURATION | Number of pads 50, 55 for n measurands, obtained according to the invention | Number of pads 50, 55 for n measurands, obtained according to the prior art |
| --- | --- | --- |
| Basic mounting | n + 2 | 3 × n |
| Mounting with a reference branch 100 integrated in a substrate 300 | n + 3 | 4 × n |
| Mounting with additional pads 56 for the control of the polarizing voltage | n + 5 | 6 × n |

The sharing of the polarizing source 10 by all the detection branches 200 does not make it possible to control, measurand by measurand, the polarizing state of the advantageously passive transducers 25. When the polarizing source 10 is activated, all the transducers 25 are polarized, and conversely. The polarizing voltage may be intermittently activated at a high frequency (103 to 104 kHz), with a low duty factor (for example, of less than 0.2).

Two methods may more particularly be considered. The first one consists of n signal conditioning stages which may be integrated in the integrated circuit specific of an application (the acronym «ASIC» for «Application-Specific Integrated Circuit»), in order to address each component simultaneously. This solution may however require important resources (for example, as regards the occupied space, the energy consumption, etc.) for the reading electronics. The second method relates to the use of buffers (of the sampler type, for example) for each measurand, making it possible to keep the mid-bridge voltage for a subsequent conditioning. This solution then requires only one analog/digital conversion stage, or even only one analog amplification stage.

The present invention is not limited to the previously mentioned embodiments but applied to any embodiment covered by the claims. Besides, the measuring circuit does not exclude the presence of other parties, among which independent Wheatstone bridges in addition.

The invention claimed is:

1. A multisensory detector comprising:
    a first substrate;
    a second substrate differing from the first substrate; and
    at least one measuring circuit,
    wherein the at least one measuring circuit includes:
        at least three detection branches connected in parallel with each other, each detection branch of the at least three detection branches having at least two dipoles mounted in series and a first connection pad disposed between and electrically connected to the at least two dipoles, and
        a reference branch having a polarizing source and another at least two dipoles mounted in series, at least the polarizing source being connected in parallel with the at least three detection branches by way of second connection pads, the another at least two dipoles, which are mounted in series, being connected in parallel with the at least three detection branches so as to form a Wheatstone bridge with each detection branch of the at least three detection branches,
    wherein the first connection pads and the second connection pads are disposed among the reference branch and the at least three detection branches, such that each said at least one measuring circuit has a total number of the first connection pads and the second connection pads equal n+2 and no more and no less, where n corresponds to a number of the at least three detection branches, and
    wherein the at least one measuring circuit is at least partially formed on the first substrate and the second substrate.

2. The detector according to claim 1, wherein said first and second substrates are assembled to form a cavity.

3. The detector according to claim 2, wherein the detector is a microelectromechanical and/or nanoelectromechanical detector.

4. The detector according to claim 3, wherein the another at least two dipoles mounted in series, of the reference branch, are located in the cavity.

5. The detector according to claim 1,
    wherein the first and second connection pads comprise a first polarizing pad, a second polarizing pad, and at least one central measuring pad,
    wherein the polarizing source of the reference branch is connected to the at least three detection branches by the first polarizing pad and the second polarizing pad, wherein each one of the at least three detection branches is connected to the at least one central measuring pad located between the at least two dipoles of the at least three detection branches, at a mid-point of the at least three detection branches, wherein at least one of the first polarizing pad, the second polarizing pad, and the at least one central measuring pad is located on the second substrate, and wherein the at least three detection branches are located on the first substrate.

6. The detector according to claim 5, wherein the another at least two dipoles mounted in series of the reference branch are positioned on the first substrate.

7. The detector according to claim 5, wherein the first polarizing pad, the second polarizing pad, and the at least one central measuring pad are each located on the second substrate.

8. The detector according to claim 5, wherein the at least one measuring circuit further comprises two additional measuring pads mounted in parallel and configured to control a polarizing voltage of the at least three detection branches.

9. The detector according to claim 1, wherein the polarizing source of the reference branch is positioned outside the first substrate and the second substrate.

10. The detector according to claim 1,
wherein said first and second substrates are assembled so as to form a cavity, and
wherein each of the at least three detection branches is located in the cavity.

11. The detector according to claim 10, wherein at least one of the first polarizing pad, the second polarizing pad, and the at least one central measuring pad is located outside the cavity.

12. The detector according to claim 11, further comprising interconnection tracks configured to route information between the at least one of the first polarizing pad, the second polarizing pad, and the at least one central measuring pad that is located outside the cavity and the at least three detection branches.

13. The detector according to claim 1, wherein said at least two dipoles and said another at least two dipoles are passive transducers.

14. A multisensory detector system comprising:
a first substrate;
a second substrate differing from the first substrate; and.
at least one measuring circuit,
wherein the at least one measuring circuit includes:
at least three detection branches connected in parallel with each other, each detection branch of the at least three detection branches having at least two dipoles mounted in series and a first connection pad disposed between and electrically connected to the at least two dipoles, and
a reference branch having a polarizing source and another at least two dipoles mounted in series, at least the polarizing source being connected in parallel with the at least three detection branches by way of second connection pads, the another at least two dipoles which are mounted in series, being connected in parallel with the at least three detection branches so as to form a Wheatstone bridge with each detection branch of the at least three detection branches, wherein the first connection pads and the second connection pads are disposed among the reference branch and the at least three detection brandies, such that each said at least one measuring circuit has a total number of the first connection pads and the second connection pads equal n+2 and no more and no less, where n corresponds to a number of the at least three detection branches, and wherein the at least one measuring circuit is formed on the first substrate and the second substrate.

* * * * *